United States Patent
Matsunaga

(10) Patent No.: US 10,811,060 B2
(45) Date of Patent: Oct. 20, 2020

(54) INFORMATION PROCESSING APPARATUS AND CONTROL METHOD THEREOF

(71) Applicant: CANON KABUSHIKI KAISHA, Tokyo (JP)

(72) Inventor: Daisuke Matsunaga, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 16/361,792

(22) Filed: Mar. 22, 2019

(65) Prior Publication Data

US 2019/0304514 A1 Oct. 3, 2019

(30) Foreign Application Priority Data

Mar. 27, 2018 (JP) ................... 2018-060895
Dec. 26, 2018 (JP) ................... 2018-243004

(51) Int. Cl.
- G11C 8/00 (2006.01)
- G11C 5/14 (2006.01)
- G11C 11/417 (2006.01)

(52) U.S. Cl.
CPC .............. *G11C 5/148* (2013.01); *G11C 5/147* (2013.01); *G11C 11/417* (2013.01)

(58) Field of Classification Search
CPC . G11C 29/52; G11C 11/5621; G11C 16/0483; G11C 5/04; G11C 5/06; G11C 5/14; G11C 5/144

USPC ... 365/227, 230.03, 185.33, 200, 222, 49.17
See application file for complete search history.

(56) References Cited

U.S. PATENT DOCUMENTS

| | | |
|---|---|---|
| 10,102,899 B2 | 10/2018 | Sawada et al. |
| 2007/0273915 A1* | 11/2007 | Nakagawa ............. G03G 21/02 358/1.14 |
| 2014/0380016 A1 | 12/2014 | Matsunaga |
| 2017/0309326 A1 | 10/2017 | Sawada et al. |
| 2019/0027212 A1 | 1/2019 | Sawada et al. |

FOREIGN PATENT DOCUMENTS

WO 2016157412 10/2016

* cited by examiner

*Primary Examiner* — Thong Q Le
(74) *Attorney, Agent, or Firm* — Venable LLP

(57) ABSTRACT

The information processing includes: a first SRAM configured to store a parameter for performing data processing for data input to a data processing unit configured to perform the data processing; a second SRAM configured to temporarily store data processed by the data processing unit; a data control unit configured to control an output of the data stored in the second SRAM; and a control unit configured to perform power control to supply power to a storage area in which the parameter of the first SRAM is stored, stop power supply to a control area for writing the data to the first SRAM and a storage area in which the data of the second SRAM is stored, and stop power supply to a control area for writing the data in a case where a job that uses the first SRAM and the second SRAM is not performed.

17 Claims, 8 Drawing Sheets

INFORMATION PROCESSING APPARATUS AND CONTROL METHOD THEREOF

BACKGROUND OF THE INVENTION

Field of the Invention

The present invention relates to a power saving technique of a memory device within an information processing apparatus.

Description of the Related Art

A semiconductor integrated circuit within the information processing apparatus includes a logic circuit that performs arithmetic operation processing and a static memory (SRAM) circuit used as a storage area of data. As the conventional power saving technique of an SRAM, an SRAM circuit has been disclosed, which has two power saving modes, that is, a resume standby mode and a shutdown mode, separate from the normal operation mode in which a data read and a data write are performed (see International Laid-Open No. 2016/157412). The resume standby mode (hereinafter, described as "RS mode") of the SRAM is an operation mode in which power consumption is reduced in the state where written data is held. The shutdown mode (hereinafter, described as "SD mode") is an operation mode in a case where the function is stopped without holding written data. By operating in these modes, a leak current in a peripheral circuit for accessing an SRAM cell or the SRAM is reduced.

SUMMARY OF THE INVENTION

An image forming apparatus on which the above-described semiconductor integrated circuit is mounted includes a normal power mode in which an operation, such as scanning and printing, is performed and a power saving mode for reducing standby power by not performing any operation, and operates by switching between the power modes. In the image forming apparatus, by controlling power supply to the semiconductor integrated circuit in accordance with the power mode, an attempt is made to suppress power consumption of the entire image forming apparatus. For example, the image forming apparatus is configured so as to be capable of performing clock gate and shutting off power supply for the logic circuit and the SRAM of the semiconductor integrated circuit.

However, in the semiconductor integrated circuit mounted on the image forming apparatus, even in a period of time during which a job that uses the SRAM is not being performed, there is a case where the subsequent job operation is affected on a condition that power supply to the SRAM is shut off and the held data is deleted. For example, in a case where the power source of the SRAM for holding image processing parameters is shut off and data is deleted in the period of time during which a job that uses the SRAM is not being performed, at the time of performing a job that uses the SRAM, it becomes necessary to set parameters again, and therefore, the recovery time is lengthened.

With the technique disclosed in International Laid-Open No. 2016/157412, in the RS mode, even in a case where it is not necessary to hold data, power supply is performed for the storage area of the SRAM circuit, and therefore, it is not possible to make an attempt to save power sufficiently because of this.

Consequently, there is a possibility that it is not possible to efficiently perform power control in accordance with a job to be processed.

An information processing apparatus of one aspect according to the present invention includes: a data processing unit configured to perform data processing; a first SRAM configured to store a parameter for performing the data processing for data input to the data processing unit; a second SRAM configured to temporarily store data processed by the data processing unit; a data control unit configured to control an output of the data stored in the second SRAM; and a control unit configured to perform power control to supply power to a storage area in which the parameter of the first SRAM is stored, stop power supply to a control area for writing the data to the first SRAM and a storage area in which the data of the second SRAM is stored, and stop power supply to a control area for writing the data in a case where a job that uses the first SRAM and the second SRAM is not performed.

Further features of the present invention will become apparent from the following description of exemplary embodiments with reference to the attached drawings.

DESCRIPTION OF THE EMBODIMENTS

In the following, embodiments of the present invention are explained with reference to the drawings. The following embodiments are not intended to limit the present invention and all combinations of features explained in the present embodiments are not necessarily indispensable to the solution of the present invention.

Embodiment

<Image Forming Aapparatus>

Figure 1:
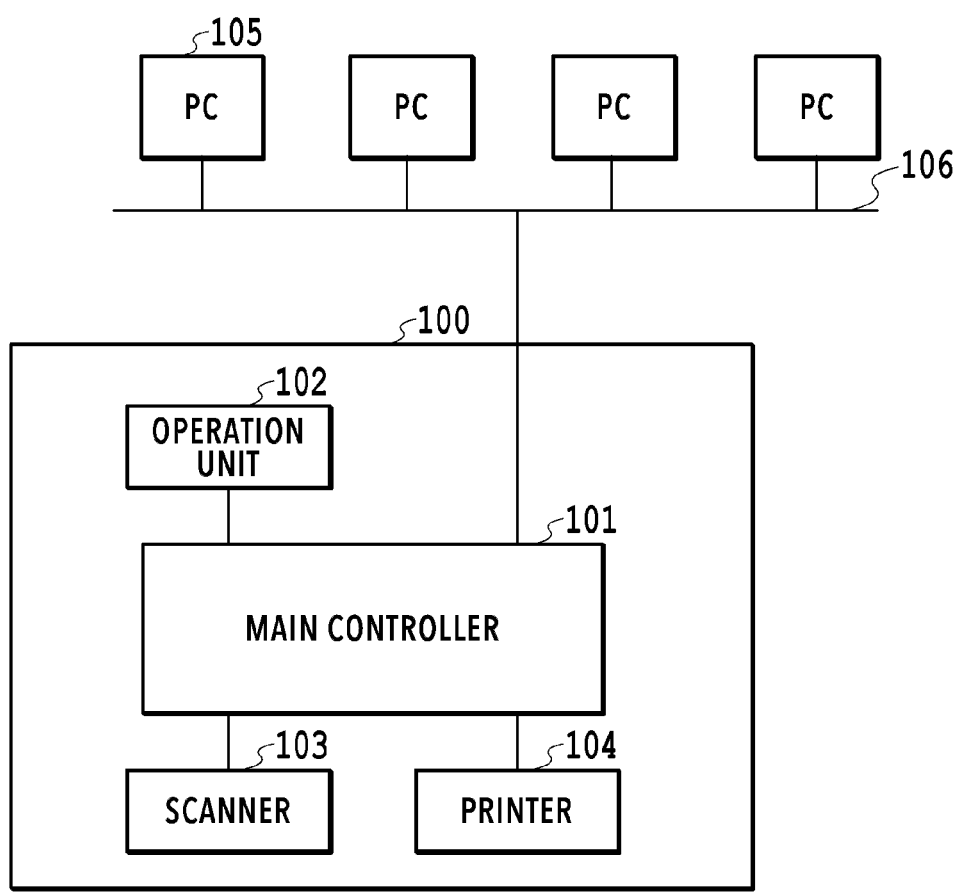
FIG. 1 is a block diagram showing an entire configuration example of an image forming apparatus in the present embodiment.

FIG. 1 is a block diagram showing an entire configuration example of an image forming apparatus in the present embodiment. An image forming apparatus 100 is an information processing apparatus and includes a print function capable of printing an image on a printing medium, such as a sheet. Further, the image forming apparatus 100 includes a scan function capable of scanning a document and transmitting an input image via a network. In the present embodiment, an example is explained in which the image forming apparatus 100 is a multi function printer (hereinafter, described as "MFP").

The image forming apparatus 100 includes a main controller 101, an operation unit 102, a scanner 103, and a printer 104. The operation unit 102, the scanner 103, and the printer 104 are each connected with the main controller 101 so as to be capable of communication and controlled by instructions from the main controller 101.

The main controller 101 is connected to a LAN (Local Area Network) 106 and connected with a PC 105 and the like via the LAN 106. The operation unit 102 includes a touch panel of a liquid crystal display and the like and receives instructions input from a user. The scanner 103 illuminates an image formed on a sheet and scans a CCD (Charge Coupled Device) provided with color filters of R (red), G (green), and B (blue). The scanner 103 converts the amount of charge acquired by the CCD into an electric signal indicating RGB color image data or grayscale image data. The printer 104 prints raster image data on a printing medium, such as a sheet.

Figure 2:
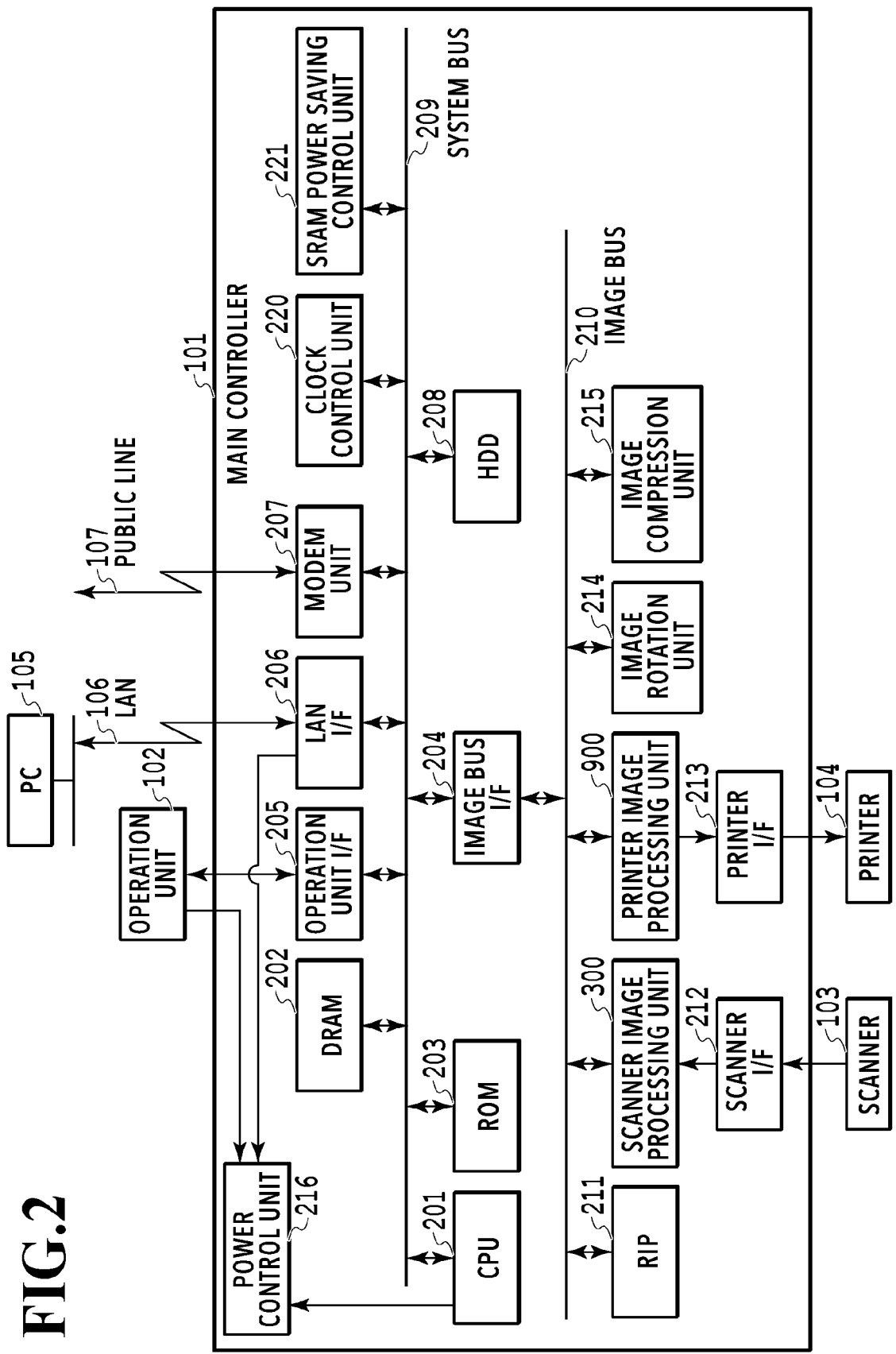
FIG. 2 is a block diagram showing an outline configuration example of a main controller.

FIG. 2 is a block diagram showing an outline configuration example of the main controller 101 in the present embodiment. The main controller 101 functions as an image processing apparatus and each function block of the main controller 101 is implemented on a semiconductor integrated circuit, for example, such as an ASIC. In the present embodiment, although a plurality of function blocks is implemented on the one ASIC, each function block may be implemented on each individual ASIC. The main controller 101 controls the scanner 103 connected via a scanner interface (hereinafter, interface is described as "I/F") 212 and the printer 104 connected via a printer I/F 213. The main controller 101 is connected to the LAN 106 via a LAN I/F 206 and connected with a public line 107 via a modem unit 207. It is possible for the main controller 101 to perform transmission and reception of a file and the like with an external device, such as the PC 105, through the LAN 106 and the public line 107.

The main controller 101 includes a CPU 201, which is a main control unit. The CPU 201 is connected with a DRAM 202, a ROM 203, an image bus I/F 204, an operation unit I/F 205, the LAN I/F 206, the modem unit 207, and an HDD (Hard Disk Drive) 208 via a system bus 209. The CPU 201 is further connected to a clock control unit 220 and an SRAM power saving control unit 221 via the system bus 209.

The DRAM 202 is a main storage device in the main controller 101 and provides a work area to the CPU 201. The DRAM 202 of the present embodiment is also used as an image memory for temporarily storing image data. The ROM 203 stores a boot program of the system. The operation I/F 205 performs transmission between the main controller 101 and the operation unit 102. For example, the operation unit I/F 205 transmits image data for a display to the operation unit 102 and transmits information whose input is received via the operation unit 102 to the CPU 201. The LAN I/F 206 performs transmission between the CPU 201 and the LAN 106. The modem unit 207 performs transmission between the CPU 201 and the public line 107. The HDD 208 is an auxiliary storage device and stores various kinds of data, such as image data, address book data, log data, and user data, used within the image forming apparatus 100.

The clock control unit 220 performs control of a clock signal (CLK) supplied to each image processing unit, to be described later in detail. Although not shown schematically in FIG. 2, the main controller 101 operates by the clock signal and a scanner image processing unit (data processing unit) 300 also operates by the clock signal. Further, the SRAM power saving control unit 221 performs power saving transition control and power saving return control (normal power return control) for the SRAM possessed by each image processing unit, to be described later in detail. The CPU 201 performs SRAM power saving transition control and SRAM power saving return control (SRAM normal power return control), to be described later in detail, by controlling the clock control unit 220 and the SRAM power saving control unit 221.

The image bus I/F 204 is an interface for transmitting image data at a high speed between the system bus 209 and the image bus 210 and converts the data structure of image data before and after transmission of the image data. That is, the image bus I/F 204 of the present embodiment functions as a bus bridge.

To an image bus 210, a RIP (Raster Image Processor) 211, the scanner image processing unit 300, a printer image processing unit 900, an image rotation unit 214, and an image compression unit 215 are connected. The RIP 211 develops PDL (Page Description Language) data transmitted from, for example, the PC 105 and received via the LAN 106 into a bitmap image.

The scanner I/F 212 is an interface for transmitting image data between the scanner 103 and the main controller 101 (scanner image processing unit 300) and performs synchronous/asynchronous conversion of image data before and after transmission of the image data. The scanner image processing unit 300 performs image processing, such as color space conversion processing and filter processing, for image data input from the scanner 103 via the scanner I/F 212.

The printer I/F 213 is an interface for transmitting image data between the printer 104 and the main controller 101 (printer image processing unit 900) and performs synchronous/asynchronous conversion of image data before and after transmission of the image data. The printer image processing unit 900 performs image processing, such as color space conversion processing, filter processing, and gamma correction processing, for image data output to the printer 104 via the printer I/F 213.

The image rotation unit 214 performs processing to rotate image data. The image compression unit 215 performs compression/decompression processing for various kinds of image data. Specifically, the image compression unit 215 performs JPEG compression/decompression processing for multivalued image data and performs compression/decompression processing, such as JBIG, MMR, and MH, for binary image data.

A power control unit 216 performs power control of the image forming apparatus 100 based on control signals from the operation unit 102, the CPU 201, and the LAN I/F 206. The power control unit 216 of the present embodiment performs power control so that the image forming apparatus 100 operates by switching between the normal power mode and the power saving mode. In the present embodiment, the normal power mode refers to a state where power is supplied to each function block of the image forming apparatus 100 and it is possible to perform the operation, such as printing, in accordance with a job whose input is received. The power saving mode refers to a state where power to each function block within the image forming apparatus 100 is shut off and power consumption is small compared to that in the normal power mode.

The main function blocks of the image forming apparatus 100 refer to, for example, the printer image processing unit 900, the RIP 211, the CPU 201, and so on, which are necessary to cause the printer 104 to perform the printing operation in accordance with a job whose input is received in the normal power mode. On the other hand, for example, the LAN I/F 206 that detects the reception of a job from the PC 105 in the power saving mode, the power control unit 216, and so on do not correspond to the main function block.

Figure 3:
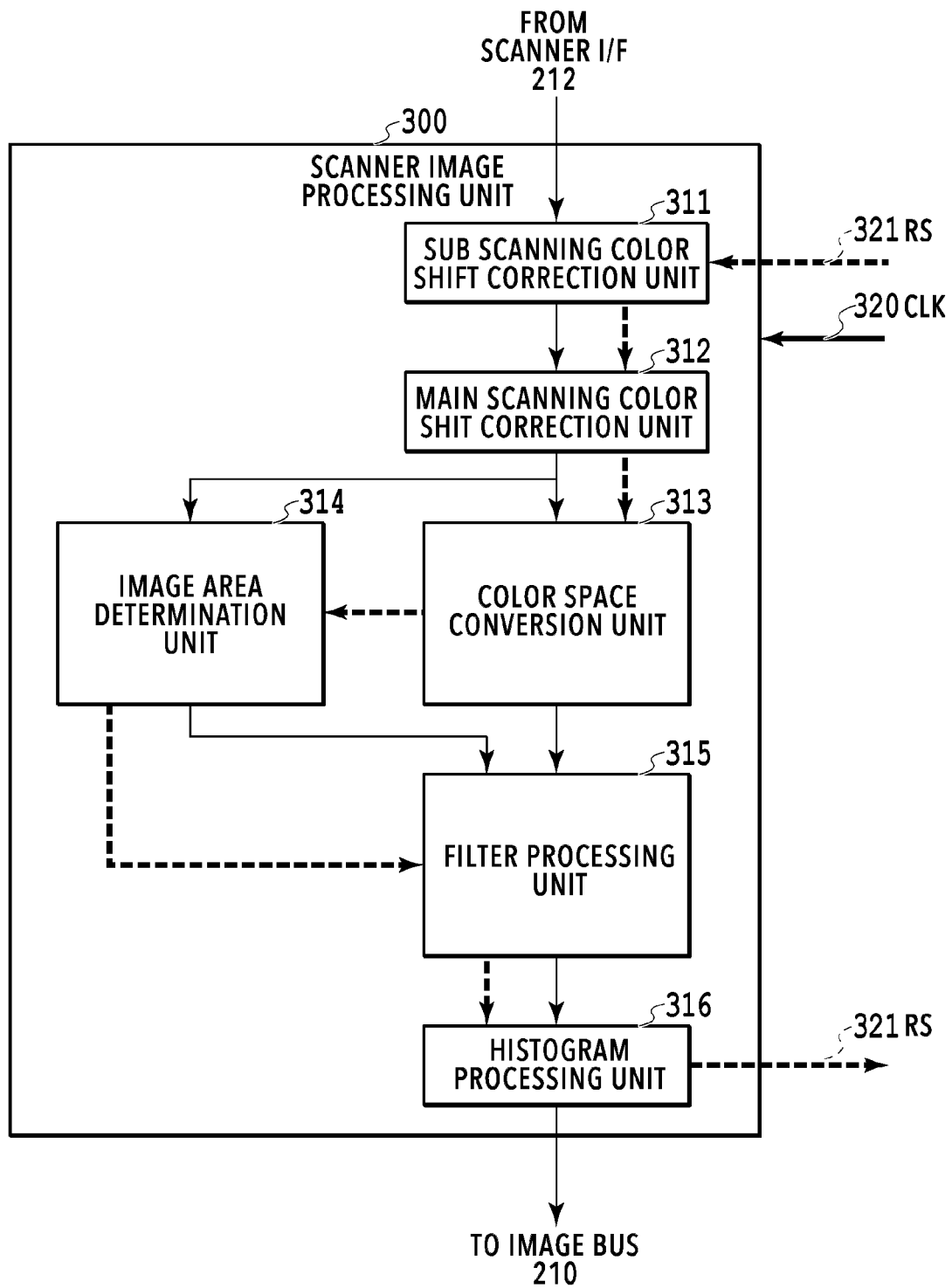
FIG. 3 is a block diagram showing an outline configuration example of a scanner image processing unit.

FIG. 3 is a block diagram showing an outline configuration example of the scanner image processing unit 300. The scanner image processing unit 300 of the present embodiment configures an image processing module group that performs image processing necessary for the image forming apparatus 100 to read an image by causing the scanner 103 to operate. The scanner image processing unit 300 is implemented on a semiconductor integrated circuit, for example, such as an ASIC, and the semiconductor integrated circuit includes a logic circuit that performs an arithmetic operation necessary for image processing and an SRAM circuit used as a storage area of data.

A sub scanning color shift correction unit 311 is an image processing module that corrects a color shift in the sub scanning direction of image data input by the scanner 103. For example, the sub scanning color shift correction unit 311 performs a matrix arithmetic operation for 8-bit pixel data of each color of RGB of image data by using a 1-pixel×3-pixel size filter with the pixel of interest being taken as a center. The sub scanning color shift correction unit 311 performs the matrix arithmetic operation for the image data by scanning the pixel of interest one by one in the main scanning direction. At this time, the sub scanning color shift correction unit 311 stores pixel data continuous in the main scanning direction in an SRAM for a line buffer (not shown schematically) in accordance with the scan of the pixel of interest.

A main scanning color shift correction unit 312 is an image processing module that corrects a color shift in the main scanning direction of image data. For example, the main scanning color shift correction unit 312 performs a matrix arithmetic operation for 8-bit pixel data of each color of RGB of image data by using a 5-pixel×1-pixel size filter with the pixel of interest being taken as a center.

A color space conversion unit 313 is an image processing module that converts image data depending on the characteristics of the scanner 103 into image data in a device-independent color space. In the present embodiment, the color space conversion unit 313 refers to a lookup table (hereinafter, described as "LUT") held in an SRAM 404 (see FIG. 4), to be described later, and converts image data depending on the characteristics of the scanner 103 into image data in a device-independent color space. Further, the color space conversion unit 313 also has an SRAM 405 (see FIG. 4) for temporarily storing image data for which the color space conversion processing described previously has been performed. The SRAM (second SRAM) 405 is provided because the number of processing steps in terms of hardware of image area determination processing in an image area determination unit 314 is large compared to that of image processing in the color space conversion unit 313. That is, the SRAM 405 functions as a delay buffer in a transmission path through which image data is transmitted to a filter processing unit from the main scanning color shift correction unit 312 via the color space conversion unit 313. Due to this, it is possible for the color space conversion unit 313 to output pixel data to the filter processing unit 315 in accordance with the timing at which the image area determination unit 314 outputs a attribute flag data to the filter processing unit 315. The detailed configuration of the color space conversion unit 313 will be described later.

The image area determination unit 314 is an image processing module that determines in which of the character portion, the photo portion, the chromatic portion, the achromatic portion, and so on the pixel of interest in the image data is included and generates attribute flag data indicating the portion in units of pixels.

The filter processing unit 315 is an image processing module that corrects image data to image data having desired spatial frequency characteristics. The filter processing unit 315 performs a matrix arithmetic operation for 8-bit pixel data of each color of RGB of image data by using a 5-pixel×5-pixel size filter with the pixel of interest being taken as a center.

A histogram processing unit 316 is an image processing module that further performs correction for the image data by creating a distribution of the pixel data configuring the image data and by changing the created distribution.

The processing in the scanner image processing unit 300 described above is not limited to the processing from the processing of the sub scanning color shift correction unit 311 to the processing of the histogram processing unit 316 and a function block that performs another kind of image processing may be included. Further, part of the processing from the processing of the sub scanning color shift correction unit 311 to the processing of the histogram processing unit 316 may be omitted. Furthermore, the order of the processing from the processing of the sub scanning color shift correction unit 311 to the processing of the histogram processing unit 316 is not limited to the above-described order.

To the scanner image processing unit 300, a clock signal (CLK) 320 is supplied. The clock signal 320 supplied to the scanner image processing unit 300 is supplied to each of the image processing units 311 to 316 described above. Whether or not to supply the clock signal 320 to each of the image processing units 311 to 316 is controlled by instructions from the CPU 201 to the clock control unit 220. Further, an RS signal 321 that transmits from the SRAM power saving control unit 221 to the scanner image processing unit 300 through the image processing units 311 to 316 is a signal for performing power saving control of the SRAM possessed by each of the image processing units 311 to 316. As indicated by broken lines in FIG. 3, the transmission path of the RS signal 321 is configured by the sub scanning color shift correction unit 311, the main scanning color shift correction unit 312, the color space conversion unit 313, the image area determination unit 314, the filter processing unit 315, and the histogram processing unit 316 being connected serially. The RS signal 321 that is output from the histogram processing unit 316, which is the image processing unit in the final stage, returns to the SRAM power saving control unit 221, that is, a so-called loopback method is adopted. The SRAM power saving control unit 221 functions, so to speak, an output unit configured to output the control signal that causes the SRAMs 404 and 405 to make a transition into the power saving mode to the SRAMs 404 and 405 connected serially.

Figure 4:
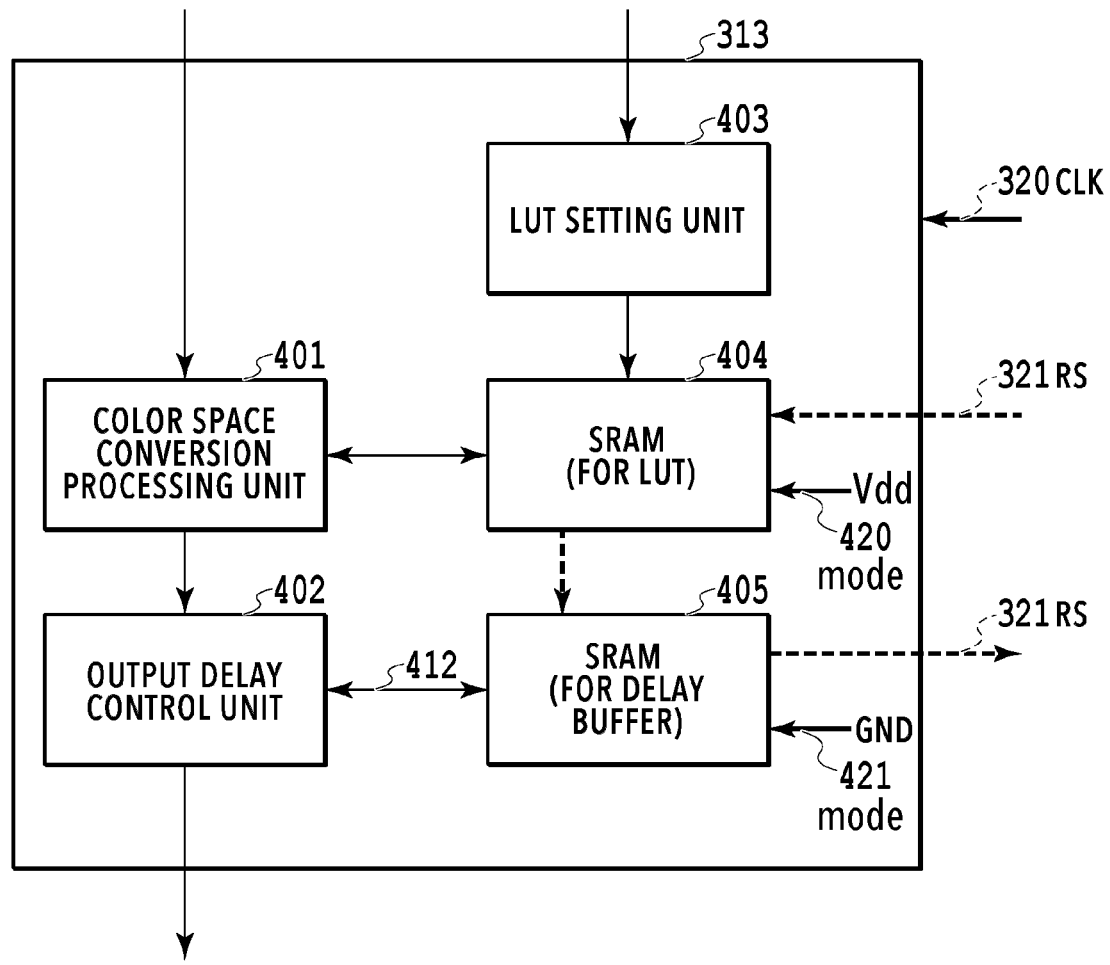
FIG. 4 is a block diagram showing an outline configuration example of a color space conversion unit.

FIG. 4 is a block diagram showing an outline configuration example of the color space conversion unit 313. A color space conversion processing unit 401 is a logic unit configured to convert RGB pixels input from the main scanning color shift correction unit 312 into device-independent sRGB pixels. The color space conversion processing unit 401 is connected with the SRAM (first SRAM) 404. The SRAM 404 is connected with an LUT setting unit 403. The LUT setting unit 403 sets an LUT, which is a conversion table referred to in color conversion processing, based on instructions from the CPU 201 and stores the set LUT in the SRAM 404. The color space conversion processing unit 401 performs color space conversion processing based on the LUT stored in the SRAM 404. The color space conversion processing unit 401 functions, so to speak, a data processing unit configured to perform data processing.

An output delay control unit 402 holds once the pixel data processed by the color space conversion processing unit 401 in the SRAM 405 and controls the delay amount for performing image processing in the filter processing unit 315 in the subsequent stage in accordance with image area determination data that is output from the image area determination unit 314 operating in parallel. That is, the output delay control unit 402 controls the delay amount by which the output of the image data in the device-independent color space is delayed so that the image data in the device-independent color space described above is output to the filter processing unit 315 at the same timing as that of the image area determination data. The output delay control unit 402 functions, so to speak, as a data control unit configured to control the output of the data stored in the SRAM 405.

The clock signal 320 supplied to the color space conversion unit 313 is supplied to each of the sub modules 401 to 405. Further, as indicated by broken lines, in the transmission path of the RS signal 321 through which the RS signal 321 is input to and output from the color space conversion unit 313, the SRAM 404 and the SRAM 405 are connected serially. Mode signals 420 and 421 are input to setting ports for setting the power saving mode of the SRAMs 404 and 405, respectively. In a case where each setting port of the SRAMs 404 and 405 connects to the Vdd like the mode signal 420 and becomes the High level, the SRAM makes a transition into the RS mode at the time of the power saving control. Further, in a case where each setting port of the SRAMs 404 and 405 connects to the GND like the mode signal 421 and becomes the Low level, the SRAM makes a transition into the SD mode at the time of the power saving control. The Vdd and GND of the mode signals 420 and 421 may be fixed in accordance with the configuration of the main controller 101, or for example, the connection destinations may be configured by the register so that it is possible to change the setting from the CPU 201.

Figure 5A:
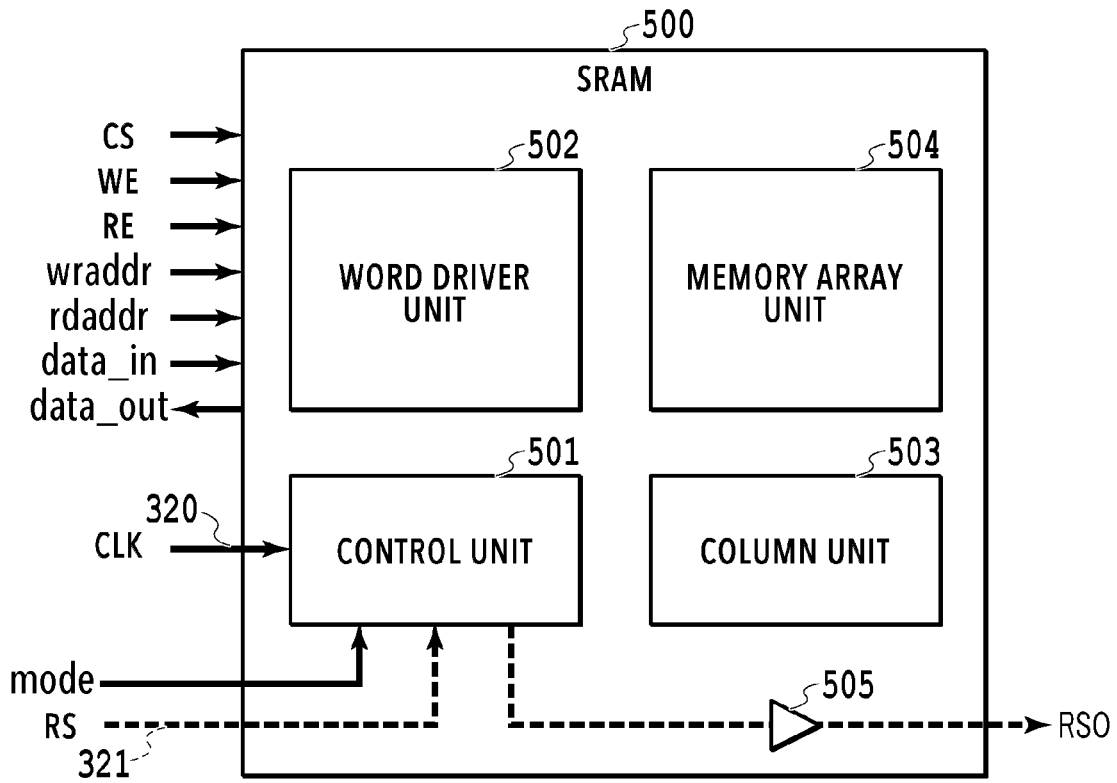
FIG. 5A to FIG. 5D are block diagrams showing detailed configuration examples of SRAMs.
Figures 5B, 5C, 5D:
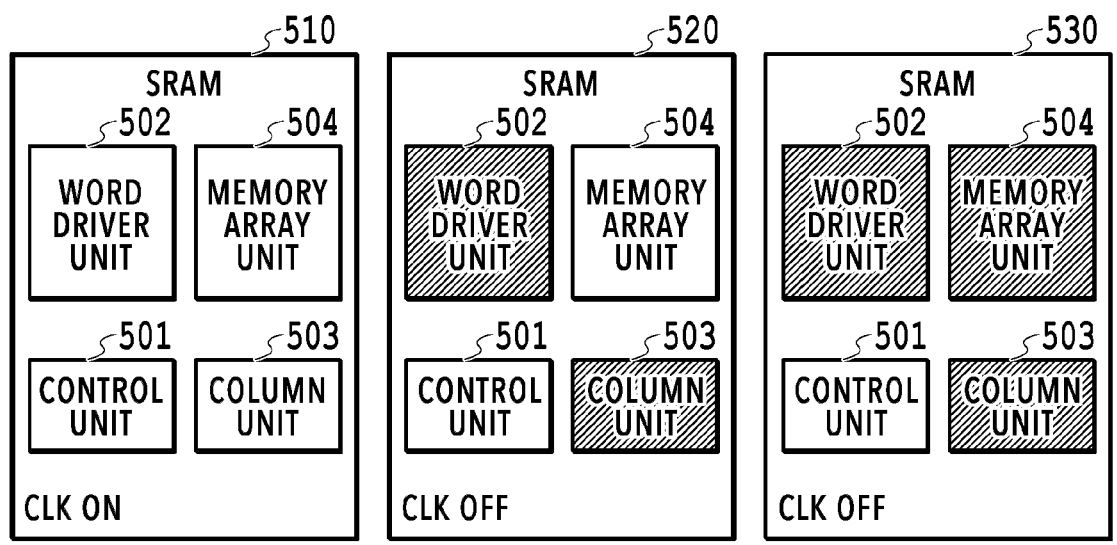

FIG. 5A is a block diagram showing a detailed configuration example of an SRAM 500 in the present embodiment. FIG. 5B to FIG. 5D are explanatory diagrams of operating state examples of the SRAM 500, and FIG. 5B shows a case of the normal power mode, FIG. 5C shows a case of the power saving mode (RS mode), and FIG. 5D shows a case of the power saving mode (SD mode). That is, the SRAM 500 is capable of making a transition into the RS mode or the SD mode and returning to the normal mode and is a power saving SRAM whose power consumption is low compared to that in the normal mode in a case where a transition is made and the SRAM 500 is in the RS mode or in the SD mode. In the present embodiment, as the SRAM 405 described previously, the SRAM having the configuration such as that of the SRAM 500 is applied and adaptive power saving control is performed. It is assumed that as the SRAM 500, a two-port SRAM capable of read access and write access at the same time is applied. In FIG. 5B to FIG. 5D, the sub module to which power is supplied is displayed by solid white and the sub module to which power supply is shut off is displayed by hatching.

As shown in FIG. 5A, to the SRAM 500, a plurality of kinds of signal is input. A CS signal, a WE signal, and an RE signal are input signals for controlling the operation timing of the SRAM 500 like signals used for general memory control. A wraddr signal, an rdaddr signal, a data_in signal, and the clock signal (CLK) 320 are input signals for write/read address control, input data control, and clock control like signals used for general memory control. The RS signal 321 is a signal for controlling transition into the power saving mode, such as the RS mode and the SD mode, and return to the normal power mode. A mode signal is an input signal for selecting the RS mode or the SD mode as the power saving mode into which a transition is made by the RS signal, and in a case of the High level a transition is made into the RS mode and in a case of the Low level, a transition is made into the SD mode. This is connected to the mode signals 420 and 421 in FIG. 4.

Further, as shown in FIG. 5A, from the SRAM 500, a plurality of kinds of signal is output. A data_out signal is an output signal for output data control like a signal used for general memory control. An RSO signal is a signal for outputting the RS signal that is input to the SRAM or the SRAM power saving control unit 221 of the module in the subsequent stage after delaying the RS signal by a predetermined time by a buffer 505. It is possible for the SRAM or the SRAM power saving control unit 221 of the module in the subsequent stage to know that the transition into the RS mode or the SD mode or the return to the normal power mode of the SRAM 500 is completed by the assert and negate timing of this signal.

A control unit 501 includes a timing control circuit that generates a timing signal of the operation from the CS signal and the WE signal. Further, the control unit 501 includes a circuit that controls power supply to a word driver unit 502, a column unit 503, and a memory array unit 504 in accordance with the RS signal and selectively shuts off power supply to those units in a case where the RS signal is at the High level.

Here, the two power saving modes, that is the RS mode (520) and the SD mode (530), in the SRAM 500 are explained. The RS mode is a mode in which power saving is performed while holding data of the SRAM 500. In a case where the RS mode is specified by the mode signal, the control unit 501 keeps (continues) power supply to the control unit 501 and the memory array unit 504 and shuts off only power supply to the word driver unit 502 and the column unit 503 as shown in FIG. 5C. On the other hand, the SD mode is a mode in which power saving at a high level compared to that in the RS mode is implemented without holding data of the SRAM 500. In a case where the SD mode is specified by the mode signal, the control unit 501 shuts off power supply to the memory array unit 504, in addition to the word driver unit 502 and the column unit 503 as shown in FIG. 5D. In a case where a transition is not made into the two power saving modes, that is, the RS mode and the SD mode, the SRAM 500 operates in the normal mode. That is, as shown in FIG. 5B, the SRAM 500 operates in the normal mode (510) in which power is supplied to the control unit 501, the word driver unit 502, the column unit 503, and the memory array unit 504. In a case where the SRAM is caused to make a transition into the power saving mode, such as the RS mode and the SD mode, it is necessary to turn off in advance the clock signal that is supplied to the SRAM as shown in FIG. 5C and FIG. 5D.

Returning to explanation of FIG. 5A, the word driver unit 502 is a function block that determines which column (row) of the memory array unit 504 to activate by decoding the addr signal. In a case where the SRAM 500 receives the RS mode or the SD mode, power supply to the word driver unit 502 is shut off by the control unit 501.

The column unit 503 is a function block that determines which row (column) of the memory array unit 504 to activate by decoding the addr signal. In a case where the SRAM 500 receives the RS mode or the SD mode, power supply to the column unit 503 is shut off by the control unit 501.

In the present embodiment, by preventing the shut off of power supply to the word driver unit 502 and the column unit 503 and the oscillation of the clock signal from overlapping each other at the time of the transition into the RS mode, the fluctuations in the voltage in the memory array unit 504 are suppressed. It can be said that the control unit 501, the word driver unit 502, and the column unit 503 in the SRAM 500 such as this are, so to speak, a control area for writing data to the memory array unit 504.

In the memory array unit 504, static memory cells are arranged in the form of a matrix and data is held in the memory cell determined by the word driver unit 502 and the column unit 503. The power supply to the memory array unit 504 is kept also in the RS mode, in addition to the time of the normal operation, and due to this, it is possible to hold data in the RS mode. On the other hand, in a case where the SRAM 500 receives the SD mode, the power supply to the memory array unit 504 is shut off by the control unit 501, and therefore, the data held in the memory array unit 504 will be lost. It can be said that the memory array unit 504 in the SRAM 500 such as this is, so to speak, a storage area that stores image data for performing image processing.

In the present embodiment, by gating the clock signal 320 for the scanner image processing unit 300 (see FIG. 3) from the CPU 201 via the clock control unit 220, it is possible to suppress power consumption in a case where the scanner image processing unit 300 is not used. In addition, by controlling the RS signal 321 from the CPU 201 via the SRAM power saving control unit 221, it is possible to further suppress power consumption of the SRAM inside the scanner image processing unit 300.

For the SRAM for holding parameters that need to be set again before the execution of the scanner image processing in a case where the data held inside the SRAM is lost, like the SRAM 404 for an LUT, the power saving control is performed by using the RS mode in which data is not lost. Due to this, after the return from the power saving mode, it is no longer necessary to set the parameters again for the SRAM 404, and therefore, it is possible to shorten the time before the execution of a job is started after the return from the power saving mode. On the other hand, for the SRAM for which the holding of the internal data of the SRAM and the re-utilization may be terminated in units of jobs of the image forming apparatus 100, like the SRAM 405 for a delay buffer, the power saving control is performed by using the SD mode whose power saving effect is higher than that of the RS mode although data is lost. In this manner, it is possible to construct a system in which both power saving and a reduction in the return time from the power saving mode are attained.

Figure 6:
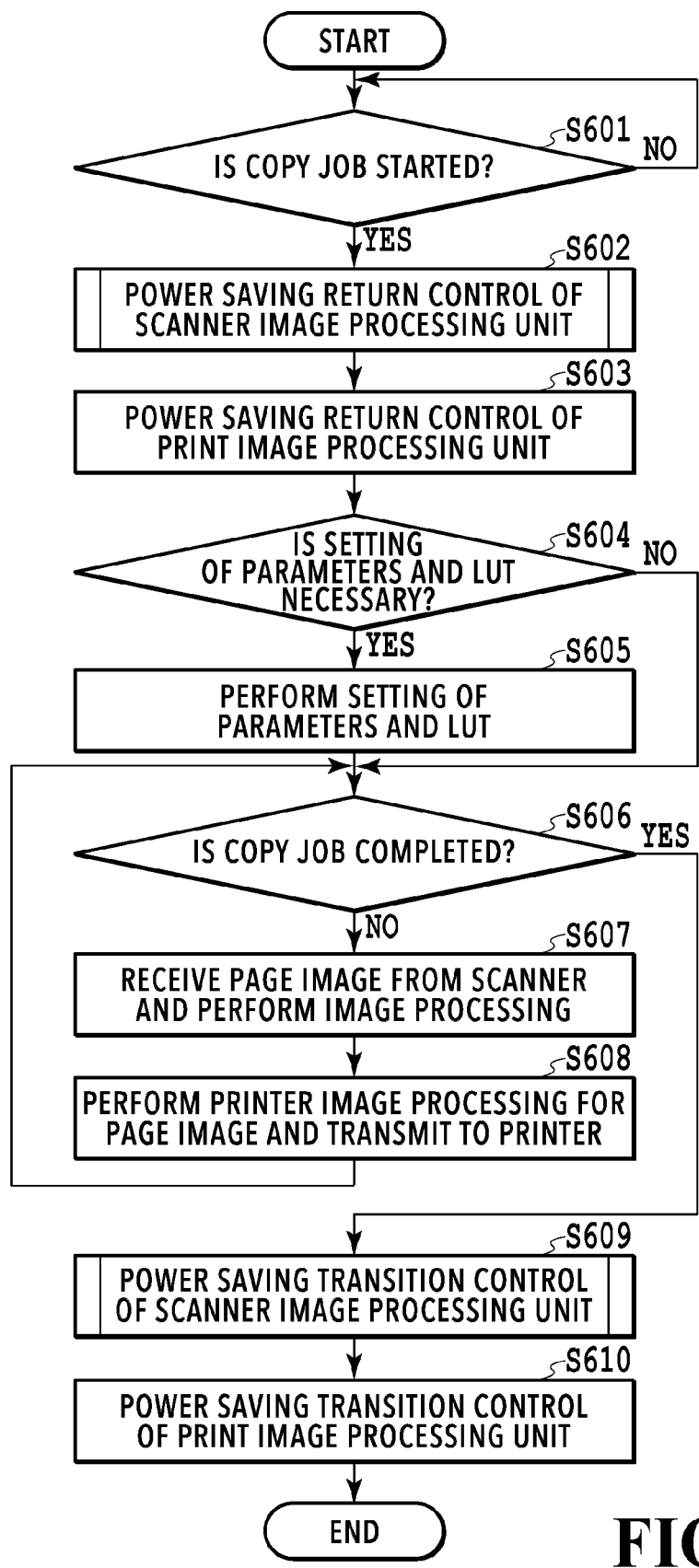
FIG. 6 is a flowchart showing a flow of SRAM power control at the time of a copy job being input to the image forming apparatus.
Figure 7A:
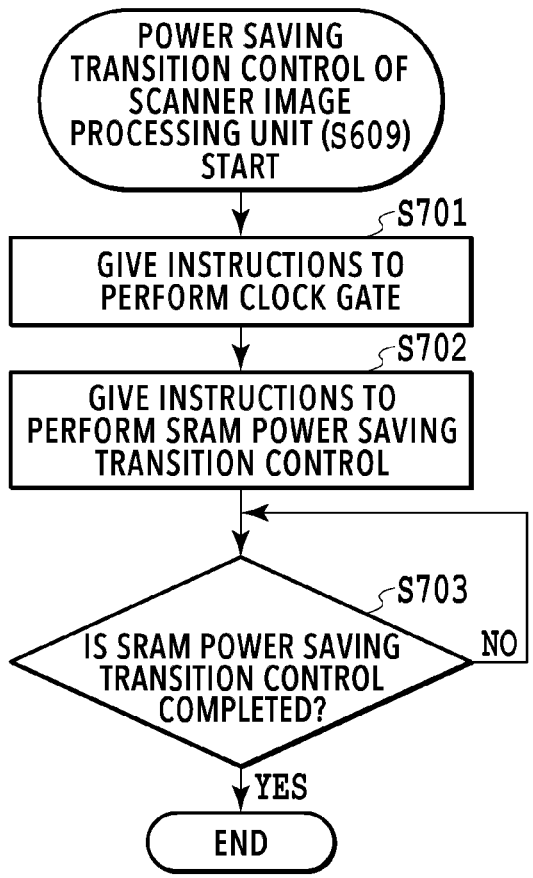
FIG. 7A and FIG. 7B are flowcharts showing details of the flow of the SRAM power control.
Figure 7B:
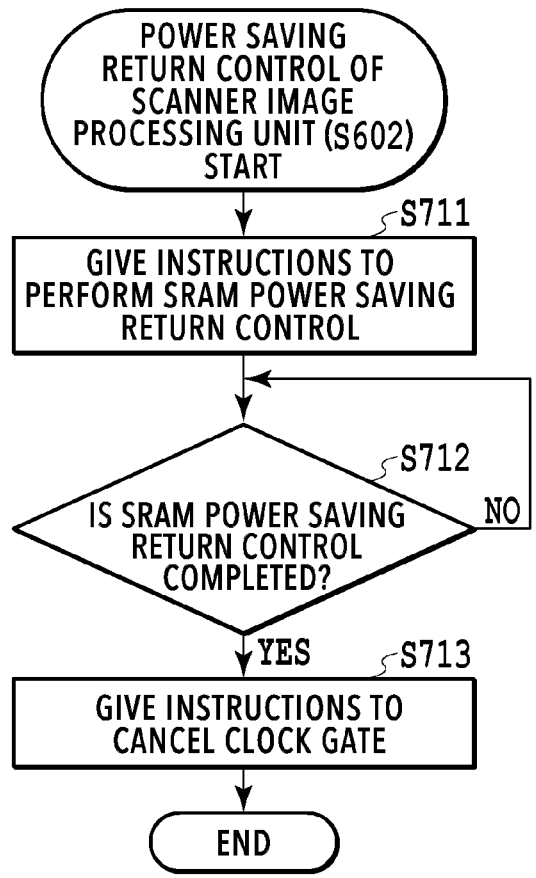

A switching method between the normal mode, the RS mode, and the SD mode of the SRAM is explained in detail by using FIG. 6, and FIG. 7A and FIG. 7B. Each symbol S in the following means that the step is a step in the flowchart.

FIG. 6 is a flowchart showing a flow of the power saving return control and the power saving transition control of the SRAMs 404 and 405 in a case where a copy job is input to the image forming apparatus 100. Unless stated in particular, each piece of processing is performed by the CPU 201. It is assumed that the SRAM 404 is held in the RS mode and the SRAM 405 is held in the SD mode before the processing described in FIG. 6 is performed. Further, it is assumed that the SRAM within the printer image processing unit 900 is also set in the RS mode or the SD mode in accordance with the use thereof and in the power saving state before the processing described in FIG. 6 is performed.

First, the CPU 201 determines whether or not a copy job is started (S601). In a case where a copy job is input to the image forming apparatus 100 by the input operation of a user via the operation unit 102, the copy job is started by control of the main controller 101 and the like. That is, the image forming apparatus 100 determines whether or not a copy job is started until the copy job is input and in a case where the copy job is input, the image forming apparatus 100 performs the copy job. In a case of determining that the copy job is started (YES at S601), the CPU 201 instructs the SRAM power saving control unit 221 to perform the power saving return control of the SRAM of the scanner image processing unit 300 (S602). The SRAM power saving control unit 221 performs the power saving return control for the SRAMs 404 and 405 of the scanner image processing unit 300 based on the instructions from the CPU 201. Details of the power saving return control will be described later.

Following the above, the CPU 201 performs the power saving return control of the SRAM of the printer image processing unit 900 (S603). That is, the CPU 201 instructs the SRAM power saving control unit 221 to return the printer image processing unit 900 to the normal power state from the power saving state. The SRAM power saving control unit 221 outputs a signal that instructs the SRAM of the printer image processing unit 900 to return to the normal mode from the RS mode or the SD mode based on the instructions from the CPU 201. The SRAM of the printer image processing unit 900 returns to the normal power state from the power saving state based on the return signal from the SRAM power saving control unit 221.

Next, the CPU 201 determines whether or not the setting of image processing parameters is necessary for the scanner image processing unit 300 and the printer image processing unit 900 used for the copy job (S604). A case where the setting of image processing parameters is necessary is a case where parameters or an LUT is not set to the SRAM 404, or a case where the setting of the copy job is changed, and therefore, it is necessary to set parameters or an LUT again to the SRAM 404. After completing the setting of parameters or an LUT, the CPU 201 sets a setting to the effect that the setting to the SRAM is completed to the register. At S604, the CPU 201 refers to the register and determines whether or not the setting of parameters or an LUT is completed. Further, the CPU 201 refers to the setting of the copy job of the previous time stored in the memory, such as the DRAM 202, different from the SRAM 404. The CPU 201 compares the setting of the copy job of the previous time with the setting of the copy job of this time and in a case where the settings are different, the CPU 201 determines that the setting of parameters or an LUT is necessary. That is, in a case of determining that the setting of image processing parameters is necessary for the scanner image processing unit 300 and the printer image processing unit 900 used for the copy job (YES at S604), the CPU 201 advances the processing to S605. In a case of determining that the setting of image processing parameters is not necessary for the scanner image processing unit 300 and the printer image processing unit 900 used for the copy job (NO at S604), the CPU 201 skips S605 and advances the processing to S606.

The CPU 201 performs the setting of parameters and an LUT for the SRAM 404 (S605). The CPU 201 sets parameters and an LUT suitable to the setting of the copy job to the SRAM 404 of the scanner image processing unit 300 and the SRAM of the printer image processing unit 900. In a case where parameters and an LUT are not set to the SRAM, the CPU 201 sets an LUT and parameters corresponding to the setting of the job of this time to the SRAM. In a case where parameters and an LUT are already set to the SRAM, the CPU 201 compares the setting of the job of the previous time stored in the DRAM 202 or the like with the setting of the job of this time and sets only parameters and an LUT corresponding to the difference to the SRAM.

In a case where the image processing parameter setting to the SRAM 404 of the scanner image processing unit 300 and to the SRAM of the printer image processing unit 900, respectively, is completed, the transfer of image data with the scanner 103 and the printer 104 is started.

The CPU 201 determines whether or not the copy job is completed (S606). The CPU 201 determines that the copy job is completed based on the completion of read of all the pages of the document and the completion of printing. Specifically, the CPU 201 determines that the copy job is completed based on the completion notification of the copy job, which is output in a case where the printer 104 completes printing of all the pages.

In a case of determining that the copy job is not completed (NO at S606), the CPU 201 advances the processing to S607. In a case of determining that the copy job is completed (YES at S606), the CPU 201 advances the processing to S609.

At S607, the CPU 201 receives a page image form the scanner 103 and stores the page image in the DRAM 202 or the like. In the process of reception, predetermined image processing is performed for the page image by the scanner image processing unit 300. In a case where the scan processing is completed after the read of all the pages set on a document table of the ADF (Auto Document Feeder) is completed, the processing at S607 is not performed and the processing at S608 is performed.

At S608, the CPU 201 inputs the page image stored in the DRAM 202 to the printer image processing unit 900 and transmits the page image to the printer 104 as copy data via the printer IF 213. The printer 104 outputs (prints) the input copy data onto a printing medium. In the process of transmission, page image processing, which is predetermined image processing, is performed for the page image by the printer image processing unit 900. Then, in a case where the processing for the page image is completed by an amount corresponding to one page, the processing is returned to S606. The CPU 201 determines whether or not the copy job is completed. Here, it is not necessarily required to perform S607 and S608 sequentially and it is also possible to perform S607 and S608 in parallel to increase the speed of the copy job operation.

At S609, the CPU 201 instructs the SRAM power saving control unit 221 to perform the power saving transition control of the scanner image processing unit 300. The SRAM power saving control unit 221 performs the power saving transition control for the SRAMs 404 and 405 of the scanner image processing unit 300 based on the instructions from the CPU 201. Details of the power saving transition control will also be described later.

At S610, the CPU 201 performs the power saving transition control of the SRAM of the printer image processing unit 900. That is, the CPU 201 instructs the SRAM power saving control unit 221 to cause the normal power state of the printer image processing unit 900 to make a transition into the power saving state. The SRAM power saving control unit 221 outputs a signal that instructs the SRAM of the printer image processing unit 900 to make a transition into the power saving state from the normal power state based on the instructions from the CPU 201. The SRAM of the printer image processing unit 900 makes a transition into the power saving state from the normal power state based on the transition signal from the SRAM power saving control unit 221.

By the above, in a case where the power saving transition control of the scanner image processing unit 300 (S609) and the power saving transition control of the printer image processing unit 900 are completed, the series of power control processing accompanying the input of the copy job to the image forming apparatus 100 is completed.

In the present embodiment, the processing example is explained in which after the copy job is completed, the SRAMs 404 and 405 included in the scanner image processing unit 300 are caused to make a transition into the RS mode and the SD mode, respectively. It may also be possible for the CPU 201 to perform the processing at S609 based on the completion notification of document read, which is output in a case where the scanner 103 completes the read of all the pages of the document, even though the printing by the printer 104 is not completed.

In the present embodiment, the case is explained where the processing at S609 is performed based on the completion notification of the copy job. It may also be possible to perform the processing at S609 in a case where a job that uses the scanner 103 for a predetermined time is not performed after the printing by the printer 104 is completed. Further, it may also be possible to perform the processing at S609 in a case where a job that uses the printer for a predetermined time is not performed after the printing by the printer 104 is completed.

There is a case where a job other than the copy job that uses the scanner 103 is started, such as a data saving function to store the input image from the scanner 103 in the HDD 208 and a transmission function to transmit the input image to another PC 105 via the LAN 106. In a case where a job other than the copy job that uses the scanner 103 is started, it may also be possible to cause the SRAMs 404 and 405 within the scanner image processing unit 300 to return to the normal power state from the power saving state and to cause them to make a transition into the power saving state again after the completion of the job.

Further, in a case where a job that does not use the scanner image processing unit 300, such as PDL print, is performed, it may also be possible to perform the power saving return control and the power saving transition control after the completion of the job only for the SRAM within the printer image processing unit 900. That is, in a case where a job that does not use the scanner image processing unit 300 is performed, it may also be possible to hold the SRAM within the scanner image processing unit 300 in the power saving state.

By performing power control in accordance with a job, at the time of performing a job that does not use the scanner image processing unit 300, it is possible to cause the SRAM within the printer image processing unit 900 to operate while keeping the SRAMs 404 and 405 within the scanner image processing unit 300 in the power saving state.

Figure 8A:
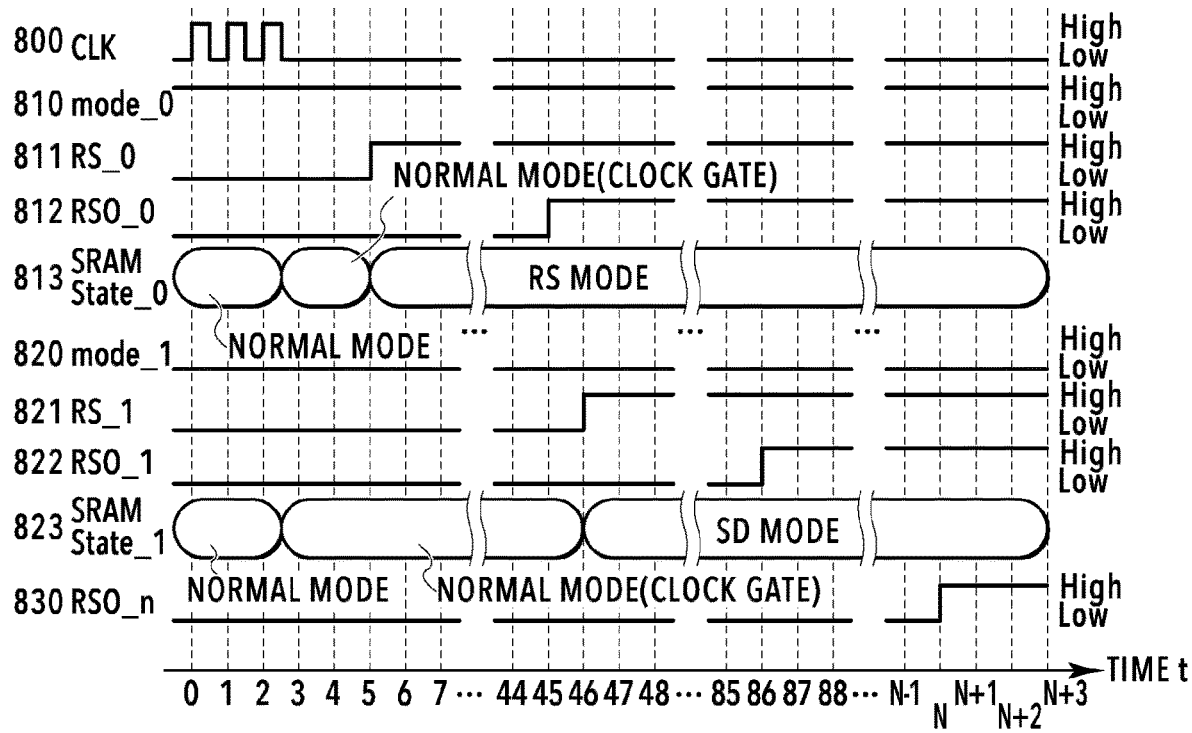
FIG. 8A and FIG. 8B are timing charts explaining an SRAM power control example.
Figure 8B:
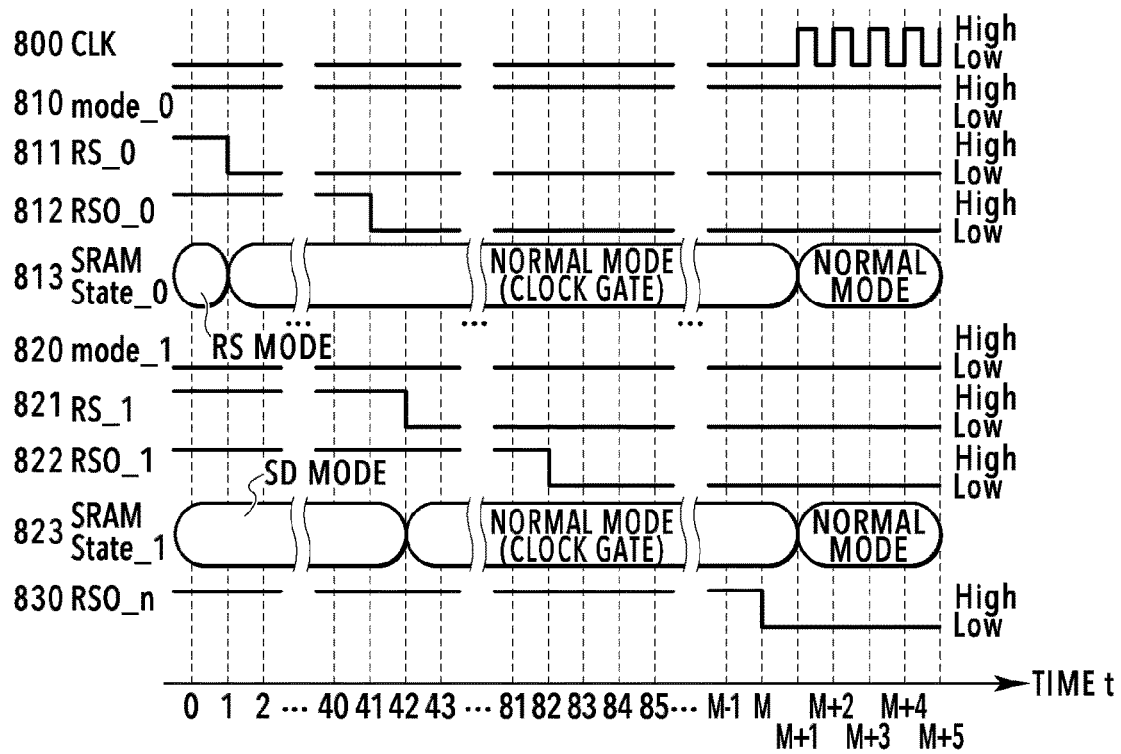

FIG. 7A is a flowchart showing details of S609 in FIG. 6. Specifically, FIG. 7A is a flowchart showing a flow of the power saving transition control of the SRAMs 404 and 405 of the scanner image processing unit 300. FIG. 7B is a flowchart showing details of S602 in FIG. 6. Specifically, FIG. 7B is a flowchart showing a flow of the power saving return control (normal power return control) of the SRAMs 404 and 405 of the scanner image processing unit 300. Further, FIG. 8A is a timing chart explaining the operation of a power saving transition control example of the SRAMs 404 and 405 of the scanner image processing unit 300. Similarly, FIG. 8B is a timing chart explaining the operation of a normal power return control example of the SRAMs 404 and 405 of the scanner image processing unit 300. In FIG. 8A, N is an integer larger than or equal to 89 and in FIG. 8B, M is an integer larger than or equal to 86.

A CLK 800 is a clock signal the same as the clock signal (CLK) 320 supplied to each of the sub modules 401 to 405 inside the color space conversion unit 313 and to the image processing units 311 to 316, which are the peripheral circuits thereof.

A mode_0 signal 810, an RS_0 signal 811, an RSO_0 signal 812, and an SRAM State_0 signal 813 represent the behavior of control signals in the power saving state of the SRAM 404 for an LUT. A mode_1 signal 820, an RS_1 signal 821, an RSO_1 signal 822, and an SRAM State_1 signal 823 represent the behavior of control signals in the power saving state of the SRAM 405 for a delay buffer.

The mode_0/1 signals 810 and 820 are signals specifying a transition into the RS mode or a transition into the SD mode in a case where each SRAM makes a transition into the power saving state. In the present embodiment, the mode signals of the SRAMs 404 and 405 are each a signal that is fixed to Vdd for the SRAM 404 and a signal that is fixed to GND for the SRAM 405 as shown in FIG. 4, and therefore, the mode_0 signal 810 is at the High level and the mode_1 signal 820 is at the Low level. The RS_0/1 signals 811 and 821 are signals for controlling the transition into the RS/SD modes and the power saving return (normal power return) of the SRAMs 404 and 405. In a case where the CLK 800 is in the gated state and the RS_0/1 signals 811 and 821 are asserted to the High level, the SRAMs 404 and 405 are in the state where the SRAMs 404 and 405 have made a transition into the RS/SD modes. The RSO_0/1 signals 812 and 822 are the RS signals 811 and 821 to which a delay is added by the buffer 505 inside the SRAM 500 and output. Then, the SRAM State_0/1 signals 813 and 823 are SRAM power state information indicating which state of the normal mode, the normal mode (clock gate), the RS mode, and the SD mode the power states of the SRAMs 404 and 405 are. An RSO_n signal 830 indicates timing at which the RS signal 321 having transmitted through all the SRAMs connected serially within the scanner image processing unit 300, including the SRAMs 404 and 405, is output from the histogram processing unit 316 in the final stage and returns to the SRAM power saving control unit 221.

In the following, unless specified particularly, it is assumed that each signal name indicates the timing of the signal in the timing charts in FIG. 8A and FIG. 8B and the notation, such as CLKXXX and CLKXXX to YYY (XXX and YYY are integers), indicates the clock timing in FIG. 8A and FIG. 8B. Further, it is assumed that CLKA 0 to N+3 are clock timing in the timing chart in FIG. 8A and CLKB 0 to M+5 are clock timing in the timing chart in FIG. 8B.

Explanation is returned to the flowcharts in FIG. 7A and FIG. 7B. It is assumed that the processing in each flow in FIG. 7A and FIG. 7B is performed by the CPU 201 unless specified particularly. In the present embodiment, it is assumed that the CPU 201 starts the power saving transition control of the scanner image processing unit 300 in a case where the execution of a job that uses the scanner image processing unit 300 is completed. In the following, by using FIG. 7A, a power saving transition control example of the scanner image processing unit 300 is explained.

First, the CPU 201 instructs the clock control unit 220 to perform clock gate of the clock signal 320 (CLK 800) supplied to the scanner image processing unit 300 (S701). Due to this, as at the timing of CLKA 3 to N+3 in FIG. 8A, the clock signal 320 (CLK 800) supplied to the SRAMs 404 and 405 is also stopped. Further, accompanying this, as indicated by the SRAM State_0/1 signals 813 and 823, the power state of each SRAM enters a state of clock gate, although the mode is in the normal mode.

Next, the CPU 201 instructs the SRAM power saving control unit 221 to perform the power saving transition control (S702). This specifically corresponds to the signal control of the timing of CLKA 5 in FIG. 8A and FIG. 8B, which asserts the RS_0 signal 811. In the SRAM 404, the mode_0 signal 810 is at the High level, and therefore, the control unit 501 of the SRAM 404 turns off (shuts off) the power supply to the word driver unit 502 and the column unit 503 in accordance with the input RS_0 signal 811. Further, accompanying the shutoff (stop) of the power supply to those sub modules 502 and 503, the power state of the SRAM 404 makes a transition into the RS mode like the SRAM State_0 signal 813.

In the present embodiment, the RS_1 signal 811 is delayed by an amount corresponding to 40 clocks by the buffer 505 and output as the RSO_0 signal 812 at the timing of CLKA 45 in FIG. 8A. Then, the RSO_0 signal 812 output at the timing of CLKA 45 is delayed by an amount corresponding to one clock by the wire length and input to the SRAM 405 as the RS_1 signal 821 at the timing of CLKA 46 in FIG. 8A.

In the SRAM 405, the mode_1 signal 820 is at the Low level, and therefore, the control unit 501 of the SRAM 405 shuts off (stops) the power supply to the word driver unit 502, the column unit 503, and the memory array unit 504 in accordance with the input RS_1 signal 821. Further, accompanying the shutoff (stop) of the power supply to those sub modules 502, 503, and 504, the power state of the SRAM 405 makes a transition into the SD mode like the SRAM State_1 signal 823.

In the present embodiment, the RS_1 signal 821 is delayed by an amount corresponding to 40 clocks by the buffer 505 and output as the RSO_1 signal 822 at the timing of the CLKA 86 in FIG. 8A. Then, after transmitting through a total of (N−1) SRAMs performing the same control afterward, the RSO_1 signal 822 returns to the SRAM power saving control unit 221 as the RSO_n signal 830 at the timing of CLK A N in FIG. 8A.

The SRAM power saving control unit 221 having asserted the RS_0 signal 811 at S702 determines whether the SRAM power saving transition control of the scanner image processing unit 300 is completed by waiting for the assert timing of the RSO_n signal 830 (S703). In a case of checking (detecting) that the RSO_n signal 830 is asserted (YES at S703), the CPU 201 completes the power saving transition control of the scanner image processing unit 300.

Next, a power saving return control example (normal power return control example) of the scanner image processing unit 300 is explained by using FIG. 7B. In the present embodiment, it is assumed that in a case where instructions to perform a job that uses the scanner image processing unit 300 are given by a user, the CPU 201 starts the normal power return control of the scanner image processing unit 300.

First, the CPU 201 instructs the SRAM power saving control unit 221 to perform the power saving return control (normal power return control) to perform the normal power control (S711). This specifically corresponds to the signal control of the timing of CLKB 1 in FIG. 8B, which negates the RS_0 signal 811. The control unit 501 of the SRAM 404 turns on (starts) the power supply to the word driver unit 502 and the column unit 503 in accordance with the input RSO signal 811. Further, accompanying the power supply to those sub modules 502 and 503, the power state of the SRAM 404 returns to the normal mode (clock gate) state like the SRAM State_0 signal 813.

Further, as described previously, the RS_0 signal 811 is delayed by an amount corresponding to 40 clocks by the buffer 505 and output as the RSO_0 signal 812 at the timing of CLKB 41 in FIG. 8B. Then, the RSO_0 signal 812 output at the timing of CLKB 41 is delayed by an amount corresponding to one clock by the wire length and input to the SRAM 405 as the RS_1 signal 821 at the timing of CLKB 42 in FIG. 8B.

The control unit 501 of the SRAM 405 supplies power to the word driver unit 502, the column unit 503, and the memory array unit 504 in accordance with the input RS_1 signal 821. The power state of the SRAM 405 returns to the normal mode (clock gate) state like the SRAM State_1 signal 823.

Further, as described previously, the RS_1 signal 821 is delayed by an amount corresponding to 40 clocks by the buffer 505 and output as the RSO_1 signal 822 at the timing of CLKB 82 in FIG. 8B. Then, after transmitting through a total of (M−1) SRAMs performing the same control afterward, the RSO_1 signal 822 returns to the SRAM power saving control unit 221 as the RSO_n signal 830 at the timing of CLK B M in FIG. 8B.

The SRAM power saving control unit 221 having negated the RS_0 signal 811 at S711 determines whether the SRAM normal power return control of the scanner image processing unit 300 is completed by waiting for the negate timing of the RSO_n signal 830 (S712). In a case of checking (detecting) that the RSO_n signal 830 is negated (YES at S712), the CPU 201 instructs the clock control unit 220 to cancel the clock gate of the clock signal 320 to be supplied to the scanner image processing unit 300 (S713). Due to this, as at the timing of CLKB M+1 to M+5 in FIG. 8B, the clock is resumed and transmitted to the SRAMs 404 and 405. Further, accompanying this, the power state of each SRAM returns to the state of the normal mode where the clock is not gated like the SRAM State_0/1 signals. By the above, the scanner image processing unit 300 returns to the state where it is possible to perform the scanner image processing and the power saving return control (normal power return control) is completed.

As above, in the present embodiment, control is performed so that the SRAM 404 for an LUT of the color space conversion unit 313 makes a transition into the RS mode as the power saving mode at the idle time and the SRAM 405 for a delay buffer makes a transition into the SD mode. Due to this, it is possible to adaptively perform power control of the SRAM 500 at the time of the image processing operation, and therefore, it is possible to implement more effective power saving control at the time of the operation of the image processing module. That is, it is possible to perform power control efficiently by setting the SRAM that needs to hold data to the RS mode and the SRAM that does not need to hold data to the SD mode at the time of power saving control of the SRAM in accordance with a job to be processed.

Modification Example

In the following, a modification example of the present embodiment is explained. In the above, although the case is explained where the present embodiment is applied to the color space conversion unit 313 of the scanner image processing unit 300, it is also possible to apply the present embodiment to another image processing unit within the scanner image processing unit 300 or to another image processing unit other than that of the scanner image processing unit 300. Even in such a case, it is possible to perform power control efficiently by setting the SRAM that needs to hold data to the RS mode and the SRAM that does not need to hold data to the SD mode at the time of the power saving control of the SRAM in accordance with a job to be processed.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

According to the present invention, it is possible to perform power control so that the SRAM that needs to hold data is set to the RS mode and the SRAM that does not need to hold data is set to the SD mode at the time of the power saving control of the SRAM in accordance with a job to be processed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2018-060895, filed Mar. 27, 2018, and No. 2018-243004, filed Dec. 26, 2018, which are hereby incorporated by reference wherein in their entirety.

What is claimed is:

1. An information processing apparatus comprising:
 a data processing unit configured to perform data processing;
 a first SRAM configured to store a parameter for performing the data processing for data input to the data processing unit;

a second SRAM configured to temporarily store data processed by the data processing unit;

a data control unit configured to control an output of the data stored in the second SRAM;

a control unit configured to perform power control to supply power to a storage area of the first SRAM in which the parameter is stored, stop power supply to a control area for writing the data to the first SRAM and a storage area of the second SRAM in which the data is stored, and stop power supply to a control area for writing the data in a case where a job that uses the first SRAM and the second SRAM is not performed; and an output unit configured to output a control signal for causing the first SRAM and the second SRAM to make a transition into a power saving mode to the first SRAM and the second SRAM connected serially.

2. The information processing apparatus according to claim 1, wherein the control unit supplies power to the storage area and the control area, both the areas of the first SRAM, and supplies power to the storage area and the control area, both the areas of the second SRAM, in a case where a job that uses the first SRAM and the second SRAM is performed.

3. The information processing apparatus according to claim 1, wherein data input to the data processing unit is image data and the parameter is a lookup table referred to by the data processing unit.

4. The information processing apparatus according to claim 3, wherein the lookup table is a conversion table referred to in color space conversion processing of the image data.

5. The information processing apparatus according to claim 1, wherein the second SRAM delays an output of data processed by the data processing unit.

6. An information processing apparatus comprising a plurality of volatile memory devices, wherein each of the volatile memory devices has a memory area, a control area configured to control a write to the memory area, and a power control circuit configured to control power supply to the memory area and the control area, and wherein the information processing apparatus comprises a power controller configured to provide a signal for causing a transition into a power saving state, the power control circuit of at least one volatile memory device of the plurality of volatile memory devices stops power supply to the control area while continuing power supply to the memory area based on the signal from the power controller, and the power control circuit of another volatile memory device of the plurality of volatile memory devices stops power supply to the memory area and the control area based on the signal from the power controller.

7. The information processing apparatus according to claim 6, wherein after causing a transition into the power saving state, power is supplied to the power control circuit of the volatile memory device.

8. The information processing apparatus according to claim 6, further comprising:

a data processing unit configured to process input data, wherein the at least one volatile memory device stores a parameter used in processing by the data processing unit.

9. The information processing apparatus according to claim 8, wherein the parameter stored in the at least one volatile memory device is a lookup table.

10. The information processing apparatus according to claim 6, wherein one of the at least one volatile memory device of the plurality of volatile memory devices delays the signal from the power controller and then outputs the signal to the another volatile memory device.

11. The information processing apparatus according to claim 6, wherein the power control circuit determines an area to which power supply is stopped of the memory area and the control area based on a voltage applied to a predetermined pin.

12. The information processing apparatus according to claim 6, wherein the power controller gives the signal to cause a transition into the power saving state in accordance with completion of a job to access the volatile memory device.

13. The information processing apparatus according to claim 6, wherein the volatile memory device is an SRAM.

14. The information processing apparatus according to claim 12, wherein the power controller instructs the volatile memory device to return from the power saving state in accordance with a job being input.

15. The information processing apparatus according to claim 6, wherein for each of the volatile memory devices, a setting is made as to whether to stop power supply to the control area while continuing power supply to the memory area based on the signal from the power controller, or to stop power supply to the memory area and the control area.

16. The information processing apparatus according to claim 6, wherein the one of the at least one volatile memory device of the plurality of volatile memory devices receives the signal from the power controller and outputs the signal to the another volatile memory device.

17. A control method of an information processing apparatus, the control method comprising:

a data processing step of performing data processing;

a step of storing a parameter for performing the data processing for data input at the data processing step in a first storage unit;

a step of temporarily storing data processed at the data processing step in a second storage unit;

a data control step of controlling an output of the data stored in the second storage unit; and a control step of performing power control to supply power to a storage area in which the parameter of the first storage unit is stored, stop power supply to a control area for writing the data to the first storage unit a storage area in which the data of the second storage area is stored, and stop power supply to a control area for writing the data in a case where a job that uses the first storage unit and the second storage unit is not performed.

* * * * *